US008748261B2

United States Patent
Takehara

(10) Patent No.: US 8,748,261 B2
(45) Date of Patent: Jun. 10, 2014

(54) METHOD OF MANUFACTURING SEMICONDUCTOR DEVICE, AND SEMICONDUCTOR DEVICE

(75) Inventor: Kei Takehara, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 405 days.

(21) Appl. No.: 13/317,697

(22) Filed: Oct. 26, 2011

(65) Prior Publication Data

US 2012/0043603 A1  Feb. 23, 2012

Related U.S. Application Data

(63) Continuation of application No. 12/662,485, filed on Apr. 20, 2010, now Pat. No. 8,071,445.

(30) Foreign Application Priority Data

Apr. 23, 2009 (JP) ................................ 2009-105289

(51) Int. Cl.
*H01L 21/336* (2006.01)
*H01L 21/76* (2006.01)
*H01L 21/311* (2006.01)

(52) U.S. Cl.
USPC ........... 438/259; 438/197; 438/270; 438/700; 257/E21.41; 257/E21.545; 257/E21.585; 257/E21.629; 257/E21.655

(58) Field of Classification Search
CPC .. H01L 29/7813; H01L 29/7802; H01L 29/407; H01L 29/66734
See application file for complete search history.

(56) References Cited

U.S. PATENT DOCUMENTS

| 2002/0036319 | A1 | 3/2002 | Baliga |
| 2004/0056284 | A1 | 3/2004 | Nagaoka et al. |
| 2007/0228518 | A1 | 10/2007 | Yilmaz et al. |
| 2009/0315083 | A1 | 12/2009 | Pan et al. |
| 2010/0084706 | A1 * | 4/2010 | Kocon ........................... 257/330 |
| 2010/0123214 | A1 | 5/2010 | Chen et al. |
| 2010/0155833 | A1 * | 6/2010 | Sumida et al. ................ 257/330 |
| 2010/0155879 | A1 * | 6/2010 | Schulze et al. ............... 257/503 |
| 2010/0163950 | A1 | 7/2010 | Gladish et al. |
| 2010/0200914 | A1 * | 8/2010 | Hamada ........................ 257/330 |
| 2010/0264489 | A1 * | 10/2010 | Ohta et al. .................... 257/334 |

FOREIGN PATENT DOCUMENTS

JP    2005-505912    2/2005

* cited by examiner

*Primary Examiner* — Mohsen Ahmadi
(74) *Attorney, Agent, or Firm* — McGinn IP Law Group, PLLC

(57) ABSTRACT

A semiconductor device includes a first-conductivity-type semiconductor layer, a base region of a second-conductivity-type formed in an upper portion of the first-conductivity-type semiconductor layer, first though third trenches penetrating through the base region and reaching to the first-conductivity-type semiconductor layer, the first through third trenches being linked to one another, a source interconnect layer buried in the first through third trenches, the source interconnect layer including a protruding portion, a gate electrode buried in the first trench and the third trench, and formed over the source interconnect layer, a source metal contacting the protruding portion of the source interconnect layer, and a gate metal contacting the gate electrode in the third trench. A contact face between the source metal and the protruding portion at the second trench is formed higher than a contact face between the gate metal and the gate electrode at the third trench.

10 Claims, 11 Drawing Sheets

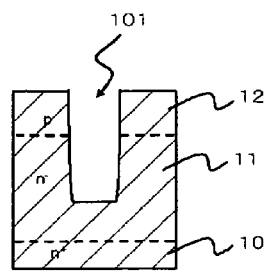 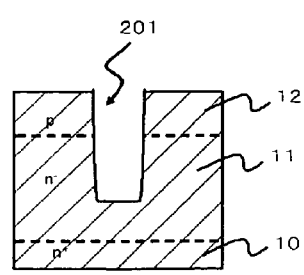 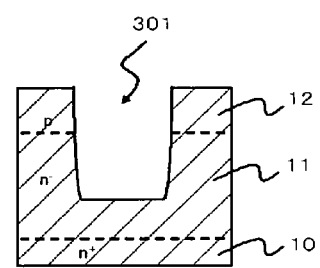
FIG. 5A    FIG. 5B    FIG. 5C
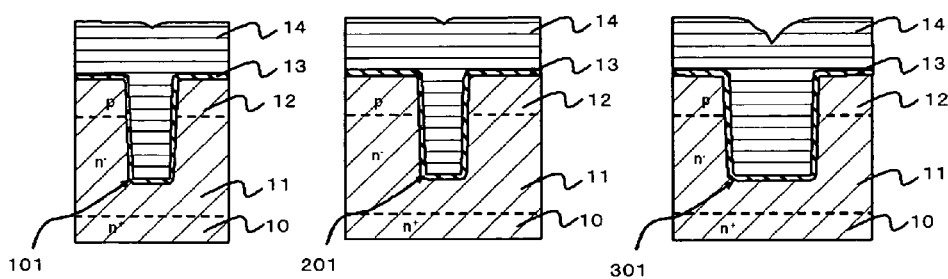
FIG. 6A    FIG. 6B    FIG. 6C

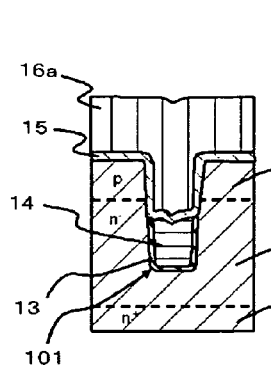 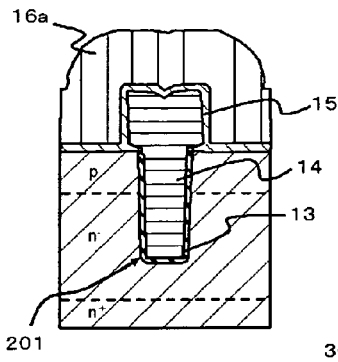 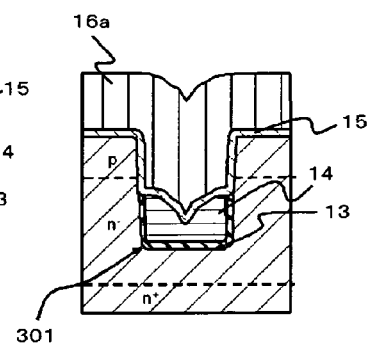
FIG. 9A  FIG. 9B  FIG. 9C
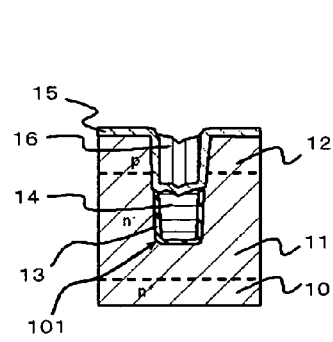 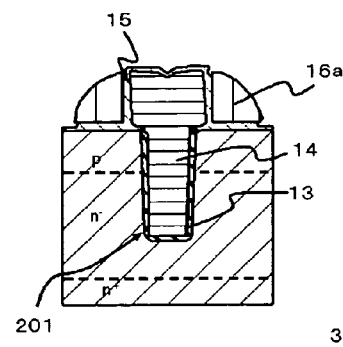 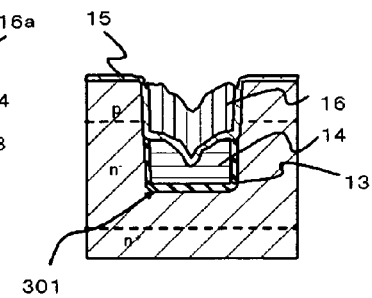
FIG. 10A  FIG. 10B  FIG. 10C

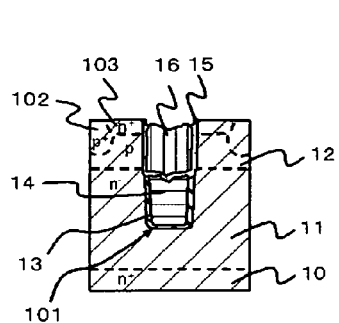 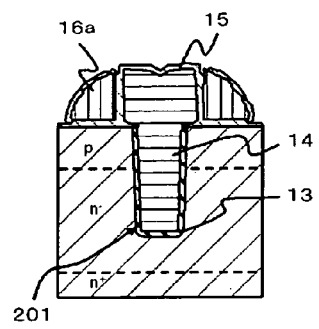 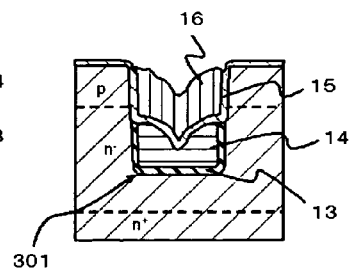
FIG. 11A  FIG. 11B  FIG. 11C
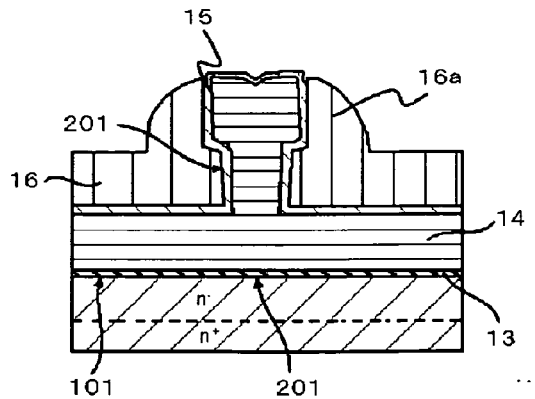 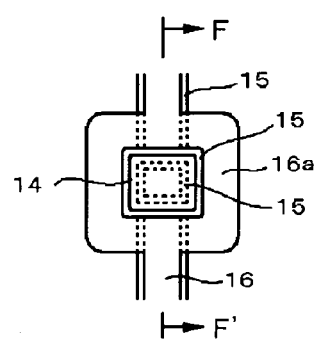
FIG. 12A  FIG. 12B
F–F'

PRIOR ART

METHOD OF MANUFACTURING SEMICONDUCTOR DEVICE, AND SEMICONDUCTOR DEVICE

RELATED APPLICATIONS

The present application is a Continuation application of U.S. patent application Ser. No. 12/662,485 which was filed on Apr. 20, 2010 now U.S. Pat. No. 8,071,445.

This application is based on Japanese patent application No. 2009-105289, the content of which is incorporated hereinto by reference.

BACKGROUND

1. Technical Field

The present invention relates to a method for manufacturing a semiconductor device, and a semiconductor device manufactured by the method.

2. Related Art

An example of a conventional vertical MOSFET (Metal-Oxide-Semiconductor Field-Effect Transistor) is disclosed in Japanese Unexamined Patent Application Publication No. 2005-505912.

This MOSFET is designed to reduce the gate-drain parasitic capacitance and improve the switching characteristics by providing a source-potential-applied polysilicon shield layer below a polysilicon gate electrode in a power transistor having a trench gate electrode.

FIGS. 14 and 15 illustrate the device disclosed in Japanese Unexamined Patent Application Publication No. 2005-505912. FIG. 15 is a cross-sectional view taken along the line E-E' of FIG. 14. In this semiconductor device, an epitaxial layer 1014 to be a low-doped drain region is formed on a substrate 1008 to be a high-doped drain region. The trench gate structure of this semiconductor device includes a gate insulating film 1032, a polysilicon gate electrode 1034, and an interlayer insulating layer 1033 formed over the gate insulating film 1032 and the polysilicon gate electrode 1034. The trench gate structure further includes a polysilicon shield layer 1038 embedded below the polysilicon gate electrode 1034 via an insulating layer 1036. A base region 1016 and a source region 1018 are formed on either side of the trench gate structure, with the source region 1018 being located above the base region 1016. The source region 1018 is connected to a source electrode 1020 formed above the source region 1018. The polysilicon shield layer 1038 extends to the outer peripheral portion of the die, and is electrically connected to the source electrode 1020, as shown in FIG. 15. In other words, the polysilicon shield layer 1038 having the same electrostatic potential as the source electrode 1020 is interposed between the polysilicon gate electrode 1034 and the drain region (the epitaxial layer 1014). With this arrangement, the switching loss caused when the gate-drain parasitic capacitance is charged and discharged during a switching transition is reduced by the polysilicon shield layer 1038 fixed at the source potential. Accordingly, the switching characteristics are improved.

However, the present inventor has recognized the following problems. According to Japanese Unexamined Patent Application Publication No. 2005-505912, the polysilicon gate electrode 1034 and the polysilicon shield layer 1038 need to be connected to the gate electrode 1039 and the source electrode 1020, respectively, as shown in FIG. 15. Therefore, the procedure for patterning the polysilicon gate electrode 1034 and the procedure for patterning the polysilicon shield layer 1038 are required. Furthermore, since the polysilicon shield layer 1038 and the source electrode 1020 are connected at the outer peripheral portion of the die, a large area is required, and the size of the die becomes large. To counter those problems, the inventor decided to make further improvements.

SUMMARY

In one embodiment, there is provided a semiconductor device including a first-conductivity-type semiconductor layer, a base region of a second-conductivity-type formed in an upper portion of the first-conductivity-type semiconductor layer, first though third trenches penetrating through the base region and reaching to the first-conductivity-type semiconductor layer, the first through third trenches being linked to one another, a source interconnect layer buried in the first through third trenches, the source interconnect layer including a protruding portion protruding from an upper end of the second trench, a gate electrode buried in the first trench and the third trench, and formed over the source interconnect layer, a source metal contacting the protruding portion of the source interconnect layer, and a gate metal contacting the gate electrode in the third trench. A contact face between the source metal and the protruding portion at the second trench is higher than a contact face between the gate metal and the gate electrode at the third trench According to the present invention, after the source interconnect layer is formed to protrude only from the upper end of the second trench, the gate electrode is buried in the first and third trenches. With this arrangement, while the gate electrode is buried in the first and third trenches, the gate electrode formed on the source interconnect layer on the second trench can be easily removed by etchback. Also, according to the present invention, the gate electrode does not extend outside the third trench, and is in contact with the gate interconnect layer inside the trench. With this arrangement, the patterning procedure with a resist for extending the gate interconnect layer and the resist removing procedure can be skipped in this embodiment, though those procedures are necessary in conventional cases. Accordingly, the number of procedures necessary to manufacture a semiconductor device with smaller gate-drain capacitance can be reduced. Further, according to the present invention, the source interconnect layer filling the second trench is designed to protrude from the upper end of the second trench. In this structure, the second trench is placed adjacent to the first trench functioning as a transistor, and the source interconnect layer and the source electrode are connected directly to each other. Accordingly, there is no need to extend interconnects to the outer peripheral portion of the device, and to form the interconnects for interconnect extensions. Thus, a smaller semiconductor device with smaller gate-drain parasitic capacitance can be realized.

According to the present invention, a semiconductor device that can reduce gate-drain parasitic capacitance can be easily manufactured.

BRIEF DESCRIPTION OF THE DRAWINGS

The above and other objects, advantages and features of the present invention will be more apparent from the following description of certain preferred embodiments taken in conjunction with the accompanying drawings, in which:

FIGS. 5A through 5C illustrate a method for manufacturing the semiconductor device according to the embodiment: FIG. 5A shows the transistor region; FIG. 5B shows the source extending region; and FIG. 5C shows the gate extending region;

FIGS. 6A through 6C illustrate the method for manufacturing the semiconductor device according to the embodiment: FIG. 6A shows the transistor region; FIG. 6B shows the source extending region; and FIG. 6C shows the gate extending region;

FIG. 7A shows the transistor region; FIG. 7B shows the source extending region; and FIG. 7C shows the gate extending region;

FIG. 8A shows the transistor region; FIG. 8B shows the source extending region; and FIG. 8C shows the gate extending region;

FIGS. 9A through 9C illustrate the method for manufacturing the semiconductor device according to the embodiment: FIG. 9A shows the transistor region; FIG. 9B shows the source extending region; and FIG. 9C shows the gate extending region;

FIGS. 10A through 10C illustrate the method for manufacturing the semiconductor device according to the embodiment: FIG. 10A shows the transistor region; FIG. 10B shows the source extending region; and FIG. 10C shows the gate extending region;

FIGS. 11A through 11C illustrate the method for manufacturing the semiconductor device according to the embodiment: FIG. 11A shows the transistor region; FIG. 11B shows the source extending region; and FIG. 11C shows the gate extending region;

FIG. 12A is a cross-sectional view of the semiconductor device in the procedure illustrated in FIGS. 10A through 10C, taken along the line F-F' of FIG. 1;

FIG. 12B is an enlarged plan view of the F-F' portion of FIG. 1 in the procedure illustrated in FIGS. 10A through 10C;

DETAILED DESCRIPTION

Figure 1:
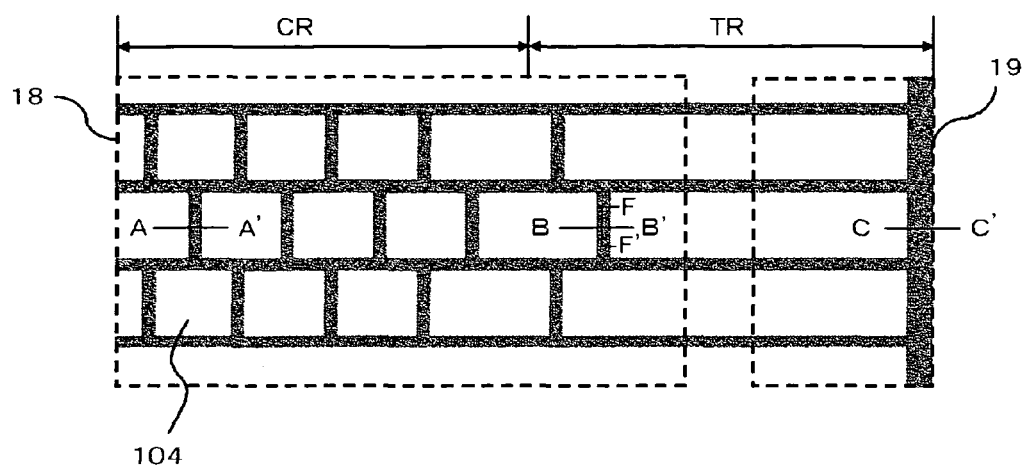
FIG. 1 is a plan view schematically showing a semiconductor device according to an embodiment.

The invention will be now described herein with reference to illustrative embodiments. Those skilled in the art will recognize that many alternative embodiments can be accomplished using the teachings of the present invention and that the invention is not limited to the embodiments illustrated for explanatory purposed.

The following is a description of embodiments of the present invention, with reference to the accompanying drawings. In the drawings, like components are denoted by like reference numerals, and explanation of them will not be repeated in the following description.

Figure 2:
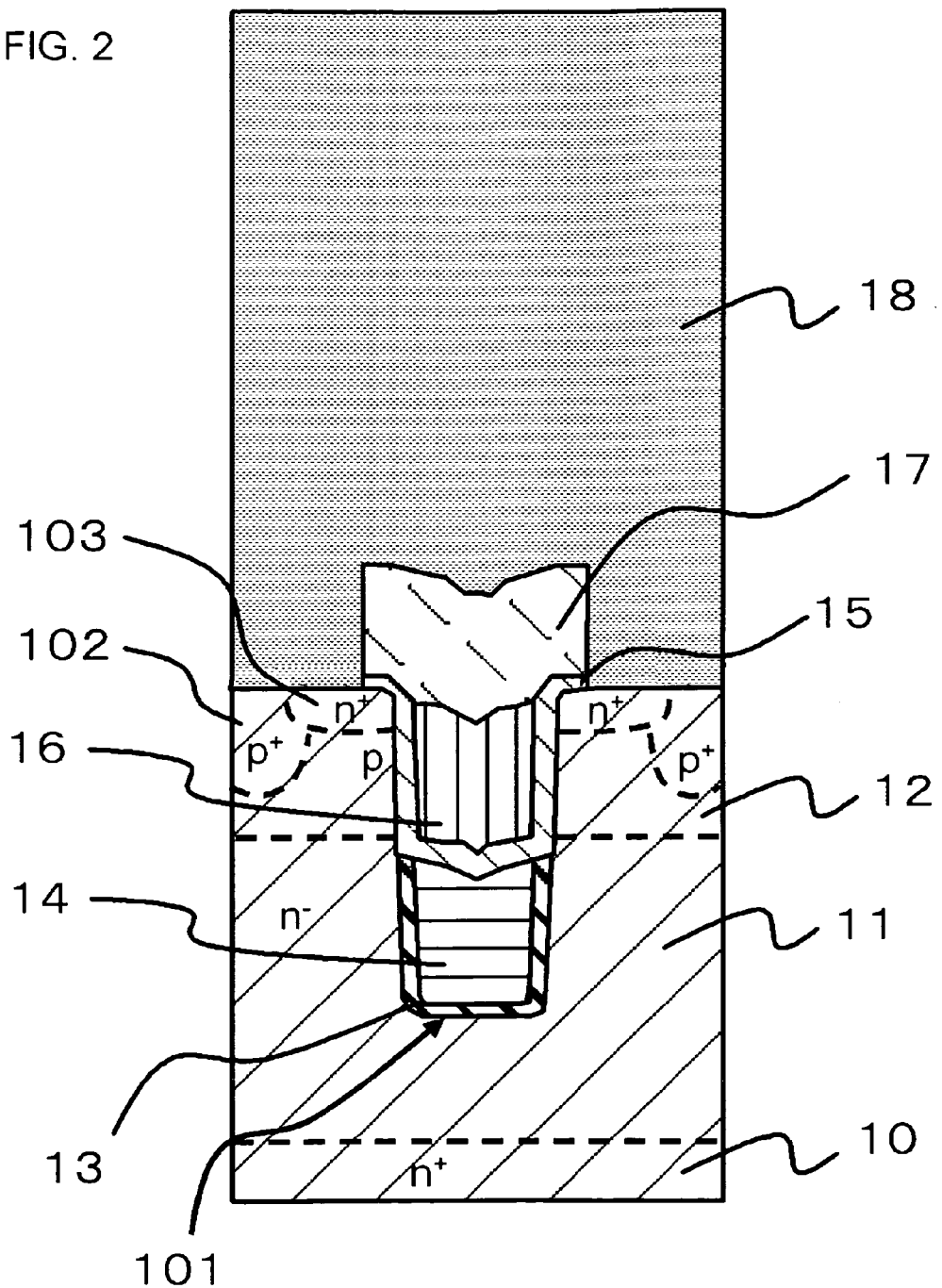
FIG. 2 is a cross-sectional view of the semiconductor device, taken along the line A-A' of FIG. 1.
Figure 3:
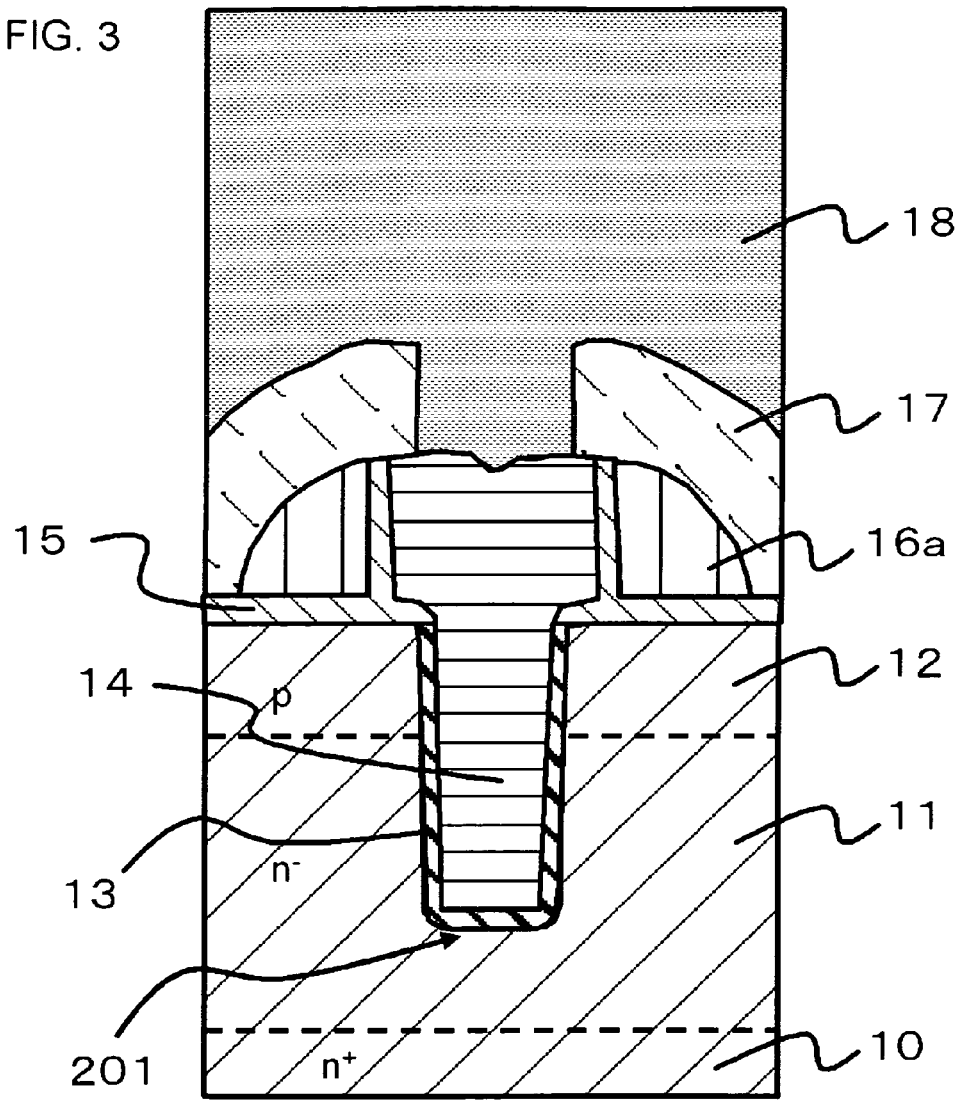
FIG. 3 is a cross-sectional view of the semiconductor device, taken along the line B-B' of FIG. 1, or a cross-sectional view of a semiconductor device, taken along the line D-D' of FIG. 13.
Figure 4:
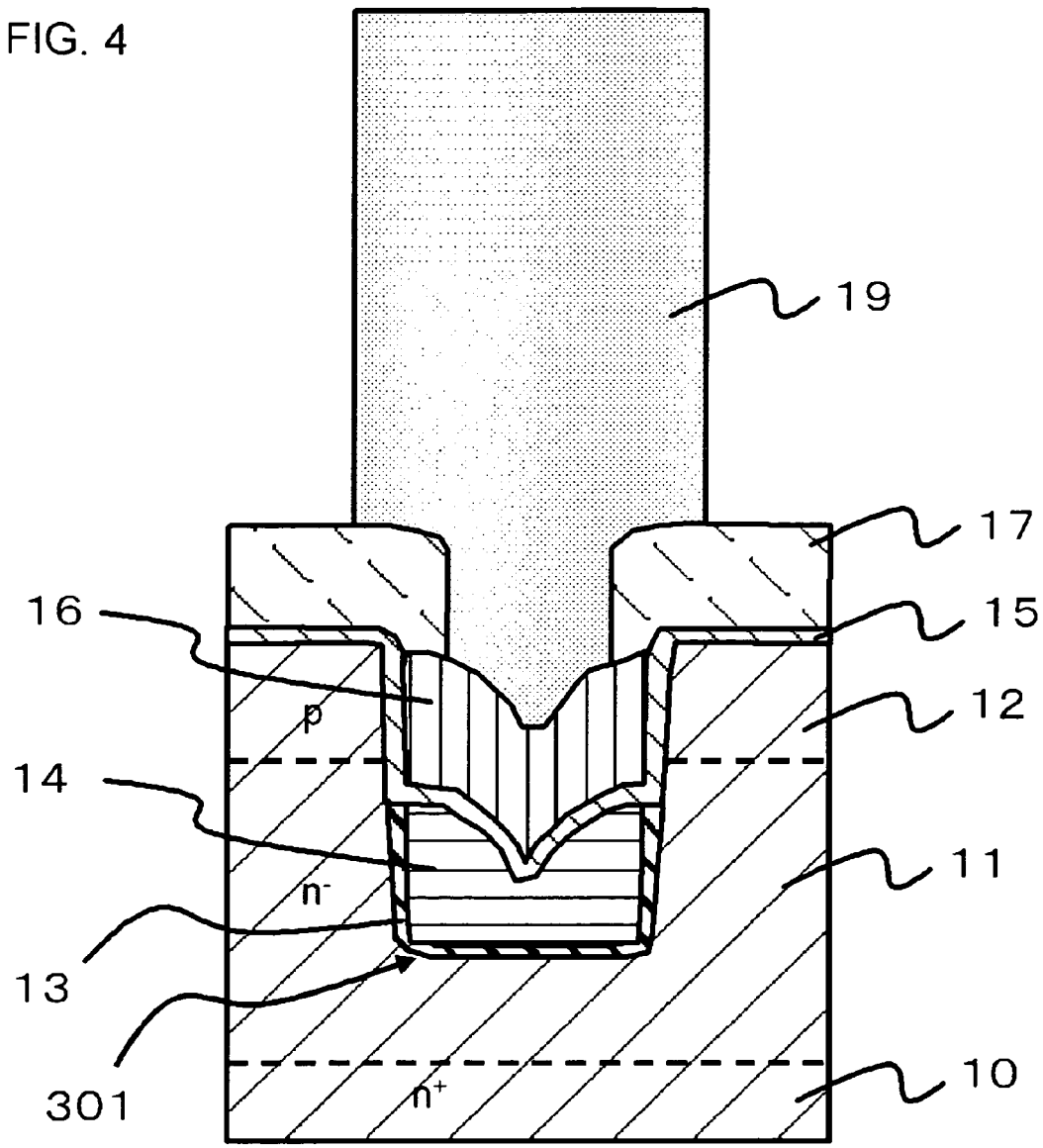
FIG. 4 is a cross-sectional view of the semiconductor device, taken along the line C-C' of FIG. 1.

FIGS. 1 through 4 are schematic views illustrating a semiconductor device according to this embodiment. This semiconductor device is a vertical MOSFET. FIG. 1 is a plan view of the semiconductor device according to this embodiment. FIG. 2 is a cross-sectional view of the semiconductor device, taken along the line A-A' of FIG. 1. FIG. 3 is a cross-sectional view of the semiconductor device, taken along the line B-B' of FIG. 1. FIG. 4 is a cross-sectional view of the semiconductor device, taken along the line C-C' of FIG. 1.

As shown in the drawings, the semiconductor device of this embodiment includes: an $n^+$-type semiconductor substrate 10 and an $n^-$-type semiconductor layer 11 (the first-conductivity-type semiconductor layer) that serve as the drain region; a p-type semiconductor layer 12 (the second-conductivity-type semiconductor layer) that is formed on the $n^-$-type semiconductor layer 11 and serves as the channel region; an $n^+$-layer 103 that is formed on the p-type semiconductor layer 12 and serves as the source region; a trench 101 (the first trench), a trench 201 (the second trench), and a trench 301 (the third trench) that penetrate through the p-type semiconductor layer 12 and are linked to one another; a source interconnect layer 14 that is buried in the trenches 101, 201, and 301, and protrudes from the top end of the trench 201; a gate electrode 16 that is buried in the trench 101 and the trench 301, and is formed on the source interconnect layer 14; a source electrode 18 that is in contact with the source interconnect layer 14 protruding from the upper end of the trench 201, and is in contact with the $n^+$-layer 103; and a gate interconnect layer 19 that is in contact with the gate electrode 16 in the trench 301. The trenches 101, 201, and 301 are connected to one another.

A cell region CR is a transistor region (FIG. 2) in which elements of the vertical MOSFET are formed. In the cell region CR, rectangular unit cells 104 are arranged at regular intervals, for example. A terminal region TR is provided along the outer circumference of the cell region CR. The terminal region TR is the region designed to secure voltage resistance of the outer circumferential edge of the die, and is also used to connect the source interconnect layer 14 and the source electrode 18, and connect the gate electrode 16 and the gate interconnect layer 19. The terminal region TR is divided into a source extending region (FIG. 3) formed by extending the source interconnect layer 14 to a location above the p-type semiconductor layer 12, and a gate extending region (FIG. 4) in which the gate interconnect layer 19 is provided.

The $n^+$-type semiconductor substrate 10 is a high-density impurity semiconductor substrate, and the $n^-$-type semiconductor layer 11 (such as an epitaxial layer) of lower impurity density than the $n^+$-type semiconductor substrate 10 is formed on the $n^+$-type semiconductor substrate 10. A drain electrode (not shown) is formed on the back face of the $n^+$-type semiconductor substrate 10, and the $n^+$-type semiconductor substrate 10 and the $n^-$-type semiconductor layer 11 constitute an n-type semiconductor layer that serves as the drain region. In the $n^-$-type semiconductor layer 11, the p-type semiconductor layer 12 that serves as the channel region is formed, and the $n^+$-layer 103 to be the source region and a $p^+$-layer 102 to be the contact region of the back gate are formed in the p-type semiconductor layer 12.

Each of the bottom faces of the trenches 101, 201, and 301 is covered with an insulating film 13 such as a thermally-oxidized film. The insulating film 13 is also formed between the source interconnect layer 14 and the sidewall of each of the trenches, and insulates the source interconnect layer 14 and the $n^-$-type semiconductor layer 11 from each other.

The upper face of the p-type semiconductor layer 12 in the gate extending region and the source extending region is covered with a gate insulating film 15. In the trench 101 and the trench 301, the gate insulating film 15 is also formed between the gate electrode 16 and each of the trenches 101 and 301. The gate insulating film 15 is also formed between the source interconnect layer 14 and the gate electrode 16, and serves as an interlayer insulating film.

In the transistor region shown in FIG. 2, the upper face of the gate electrode 16 is covered with an interlayer film 17. The interlayer film 17 formed in the transistor region protrudes above the trench 101 in the example illustrated in FIG. 2. However, the present embodiment is not limited to that arrangement, and the interlayer film 17 may be buried inside the trench 101.

In the source extending region shown in FIG. 3, the source interconnect layer 14 extends to a location above the trench 201. A side-wall-like conductive film 16a made of the same material as the gate electrode 16 is formed on the sidewall of the source interconnect layer 14. This conductive film 16a is part of the conductive film forming the gate electrode 16. The conductive film 16a connects the ends of the gate electrodes 16 in the trench 201 shown in FIG. 12A to each other as shown in FIG. 12B. In the interlayer film 17, a contact hole for exposing part of the source interconnect layer 14 is formed, and the source interconnect layer 14 and the source electrode 18 are connected to each other via the contact hole.

In the gate extending region shown in FIG. 4, the source interconnect layer 14 is buried in the trench 301, as in the transistor region (FIG. 2). In the interlayer film 17, a contact hole for exposing part of the gate electrode 16 is formed, and the gate electrode 16 and the gate interconnect layer 19 are connected to each other via the contact hole.

The operation of this vertical MOSFET is as follows. A predetermined drain voltage $V_{DS}$ is applied between the source electrode 18 and the drain region (the n$^+$-type semiconductor substrate 10), and a predetermined gate voltage $V_{GS}$ is applied between the source electrode 18 and the gate electrode 16. By doing so, the conductivity type of the p-type semiconductor layer 12 in the vicinity of the gate insulating film 15 is reversed to the n-type in the transistor region shown in FIG. 2, and a charge channel is formed. This channel permits conduction between the source and the drain (ON state).

By adjusting the gate voltage $V_{GS}$ applied between the source electrode 18 and the gate electrode 16 in the ON state to 0 V or a negative voltage (a reverse bias), the gate is turned off, and the conductivity type of the p-type semiconductor layer 12 reversed to the n-type in the vicinity of the gate insulating film 15 is returned to the p-type. In this manner, conduction between the source and the drain is prohibited (OFF state).

A source potential is applied to the source interconnect layer 14, and serves as a shield between the gate electrode 16 and the drain region (the n$^-$-type semiconductor layer 11). Accordingly, when high-speed switching is required, the switching loss caused in charging and discharging the gate-drain parasitic capacitance during a switching transition can be reduced. The switching characteristics are improved in this manner. As described above, the vertical MOSFET of this embodiment can operate as a power switching element having switching characteristics as good as the vertical MOSFET disclosed in Japanese Unexamined Patent Application Publication No. 2005-505912.

Referring now to FIGS. 5A through 12B, a method for manufacturing the vertical MOSFET of this embodiment is described. In FIGS. 5A through 11C, each of FIGS. 5A, 6A, 7A, 8A, 9A, 10A, and 11A shows the transistor region (a cross section taken along the line A-A' of FIG. 1). Each of FIGS. 5B, 6B, 7B, 8B, 9B, 10B, and 11B shows the source extending region (a cross section taken along the line B-B' of FIG. 1). Each of FIGS. 5C, 6C, 7C, 8C, 9C, 10C, and 11C shows the gate extending region (a cross section taken along the line C-C' of FIG. 1). FIG. 12A is a cross-sectional view taken along the line F-F' of FIG. 1. FIG. 12B is a plan view of the source extending region.

First, the p-type semiconductor layer 12 is formed on a wafer formed by stacking the n$^-$-type semiconductor layer 11 on the n$^+$-type semiconductor substrate 10 through ion implantation and a thermal diffusion process. Resist patterning, silicon etching, or the like is then performed to form a trench that reaches the n$^-$-type semiconductor layer 11. The portion of the trench formed in the cell region CR at the center of the die is referred to as the trench 101. The portion of the trench formed in the source extending region formed in the terminal region TR along the outer circumference of the die is referred to as the trench 201. The portion of the trench formed in the gate extending region is referred to as the trench 301. In this structure, the trenches 101, 201, and 301 are a series of trenches that are connected to one another. The opening width of each of the trenches 101 and 201 is 0.5 μm, for example. The opening width of the trench 301 is 1.0 μm, for example.

The insulating film 13 is then formed on the inner wall of each of the trenches 101, 201, and 301 through thermal oxidation, as shown in FIGS. 6A through 6C. A conductive film formed with a first polysilicon film that is to be the source interconnect layer 14 is then formed. Here, the first polysilicon film fills the trenches 101, 201, and 301, and is designed to protrude from the upper end of the trench 201. The film thickness of the first polysilicon film should be determined so that the source interconnect layer 14 in the trenches 101, 201, and 301 is continuous without a disconnected part, and that the source interconnect layer 14 protrudes from the upper end of the trench 201. For example, the film thickness of the first polysilicon film is 0.6 μm. If the width of the trench 201 is large, the first polysilicon film might not completely fill the trench 201 (being a film-like component covering the side faces and bottom face of the trench 201). However, no problems are caused, since the source electrode 18 can be connected to the portion of the first polysilicon film protruding from the upper end of the trench 201.

Figures 7A, 7B, 7C:
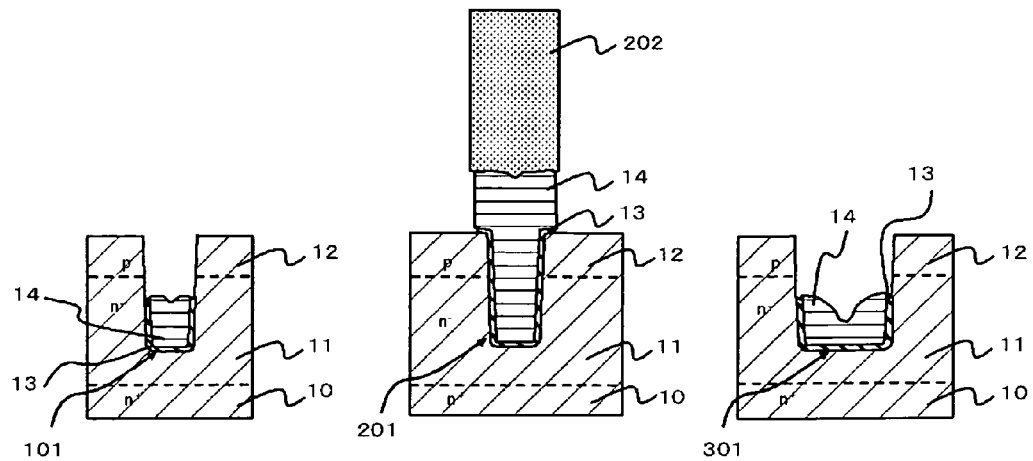
FIGS. 7A through 7C illustrate the method for manufacturing the semiconductor device according to the embodiment.

The first polysilicon film is then protected by a resist 202 only at the portion to be brought into contact with the source electrode 18 in the source extending region (FIG. 7B). Etching is then performed so that the first polysilicon film in the trench 101 in the transistor region and in the trench 301 in the gate extending region has a desired thickness. With this arrangement, a structure in which the source interconnect layer 14 protrudes from the upper end of the trench 201 is formed on the trench 201 in the source extending region. At the same time, the source interconnect layer 14 is buried in the trenches 101 and 301.

Figures 8A, 8B, 8C:
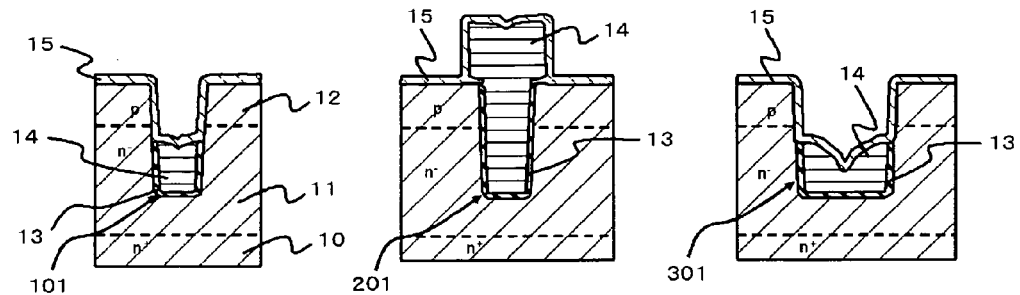
FIGS. 8A through 8C illustrate the method for manufacturing the semiconductor device according to the embodiment.

The gate insulating film 15 is then formed on the source interconnect layer 14 through thermal oxidation, CVD (Chemical Vapor Deposition), or the like, as shown in FIGS. 8A through 8C.

The conductive film 16a formed with a second polysilicon film that is to be the gate electrode 16 is then formed on the gate insulating film 15, as shown in FIGS. 9A through 9C.

The conductive film 16a is then removed by etchback without formation of a resist mask, and the gate electrode 16 filling the trenches 101 and 301 is formed as shown in FIGS. 10A and 10C. With this arrangement, the gate electrode 16 is formed on the source interconnect layer 14 via the gate insulating film 15. In the source extending region, the conductive film 16a is formed to remain like a sidewall on the sidewall of the source interconnect layer 14, as shown in FIG. 10B. This side-wall-like conductive film 16a is not buried in the trench 201, but continues to the gate electrode 16 at the front and rear portions of the source extension, as shown in FIGS. 12A and 12B.

After the exposed portion of the gate insulating film 15 in the transistor region is removed as shown in FIG. 11A, ions are implanted into the surface of the p-type semiconductor layer 12, and a procedure such as a heating process is carried out to form the p$^+$-layer 102 and the n$^+$-layer 103.

The upper face of the gate electrode 16 is then covered with the interlayer film 17. After that, contact holes are formed by performing resist patterning and etching on the upper faces of the source interconnect layer 14 in the source extending region and the gate electrode 16 in the gate extending region, for example. A metal layer (such as an aluminum layer) that is to be an electrode is then formed, and resist patterning and etching are performed in this order, to form the source electrode 18 and the gate interconnect layer 19. In this manner, the MOSFET illustrated in FIGS. 1 through 4 is completed.

The effects and advantages of this embodiment are now described. According to this embodiment, the source interconnect layer 14 is designed to protrude only from the upper end of the trench 201 (the source extending region). After that, the second polysilicon film to form the gate electrode 16 is formed, and etchback is performed without a resist mask. By doing so, the unnecessary portions of the second polysilicon film protruding from the upper ends of the trenches 101 and 301 are easily removed by etchback. In this embodiment, the extending portion of the gate electrode 16 does not extend outward from the trench 301, but is in contact with the gate interconnect layer 19 inside the trench 301. With this arrangement, the patterning procedure with a resist for extending the gate electrode 16 and the resist removing procedure can be skipped in this embodiment, though those procedures are necessary in conventional cases. Accordingly, a semiconductor device with smaller gate-drain parasitic capacitance can be manufactured by a smaller number of manufacturing procedures than in conventional cases.

In the semiconductor device of this embodiment, to secure a necessary area for the contact hole for connecting with the source electrode 18, the source interconnect layer 14 is designed to protrude immediately above the trench 201, so that the necessary areas for the contacts with the source interconnect layer 14 and the source electrode 18 become smaller. Also, the trench 101 of the transistor region and the trench 201 of the source extending region are arranged adjacent to each other, and the source interconnect layer 14 and the source electrode 18 are connected directly to each other. With this arrangement, there is no need to extend interconnects to the outer peripheral portions as in conventional cases, and to form an aluminum interconnect for a source potential extension and the source electrode separately from each other. Accordingly, a smaller semiconductor device with smaller gate-drain parasitic capacitance can be realized. The conductive film 16a remaining on the sidewall of the source interconnect layer 14 in the source extending region (the trench 201) is insulated from the source interconnect layer 14 and the source electrode 18 by the gate insulating film 15 and the interlayer film 17, and accordingly, causes no problems.

Although an embodiment of the present invention has been described so far with reference to the accompanying drawings, this embodiment is merely an example, and various other structures may be employed in the present invention.

For example, the trench 201 is formed in the terminal region TR in this embodiment. However, the source extending region (FIG. 3) of the present invention may be provided in the cell region CR.

Figure 13:
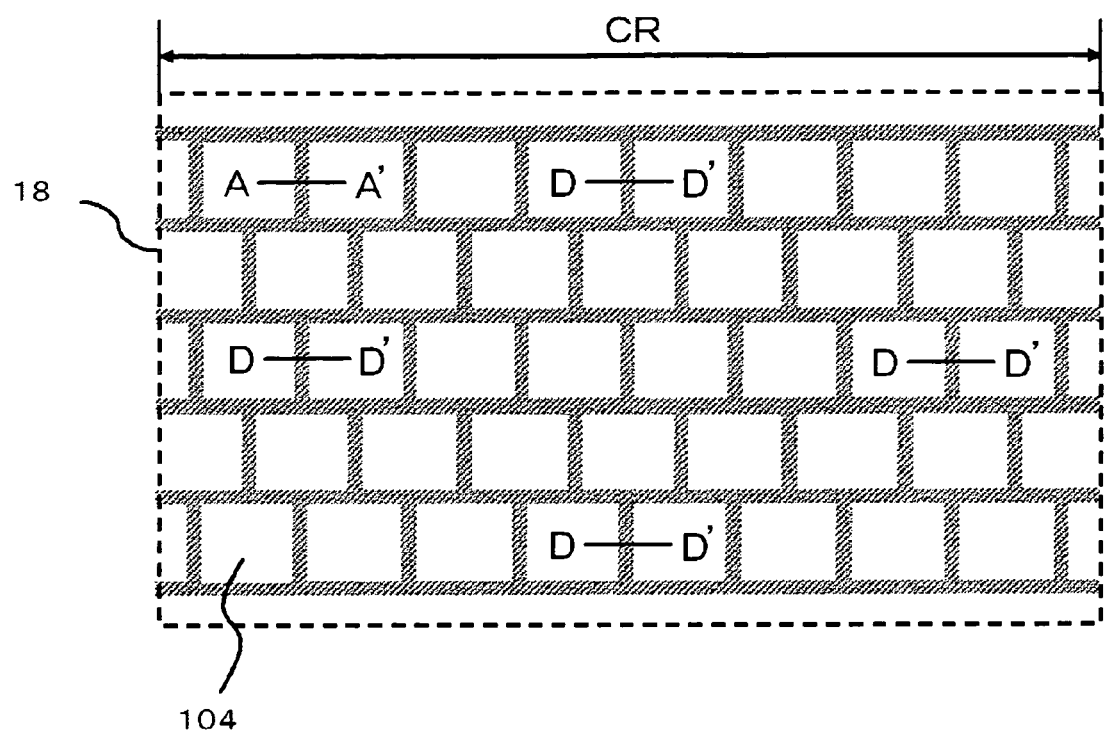
FIG. 13 is a plan view illustrating a modification of the semiconductor device according to the embodiment.
Figure 14:
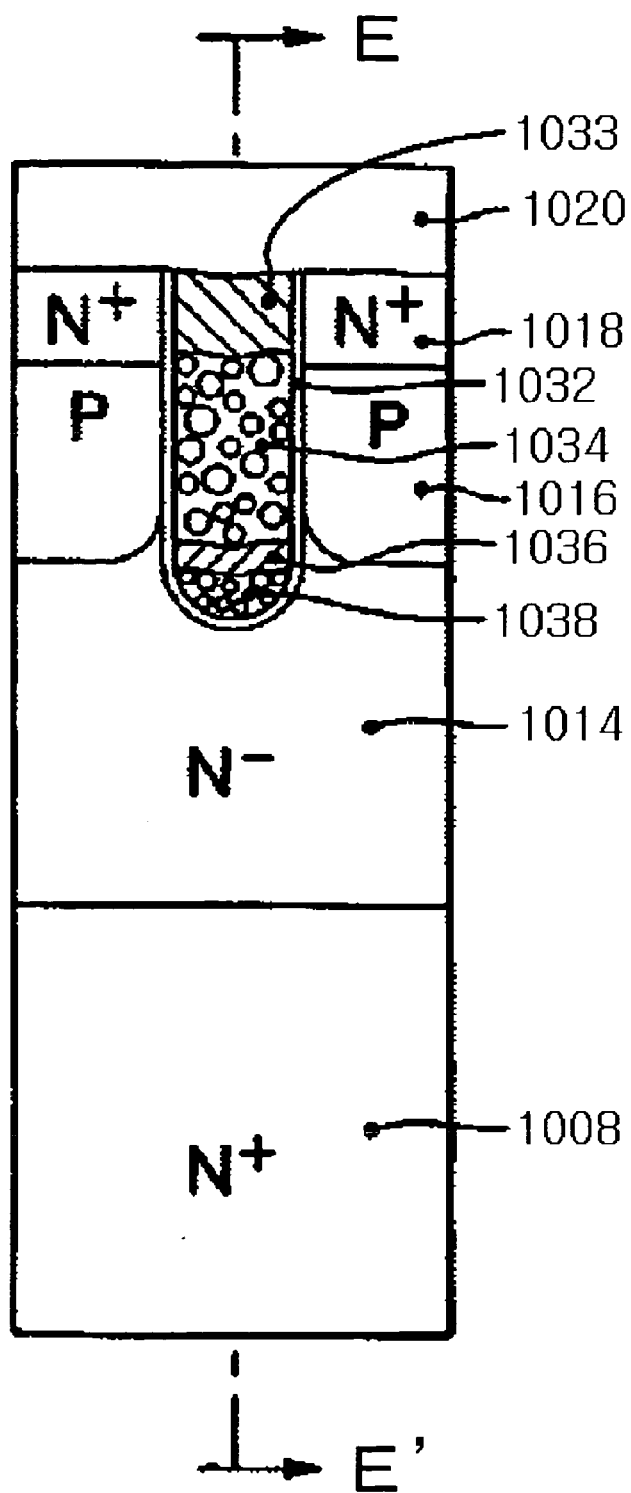
FIG. 14 is a cross-sectional view of a conventional vertical MOSFET.
Figure 15:
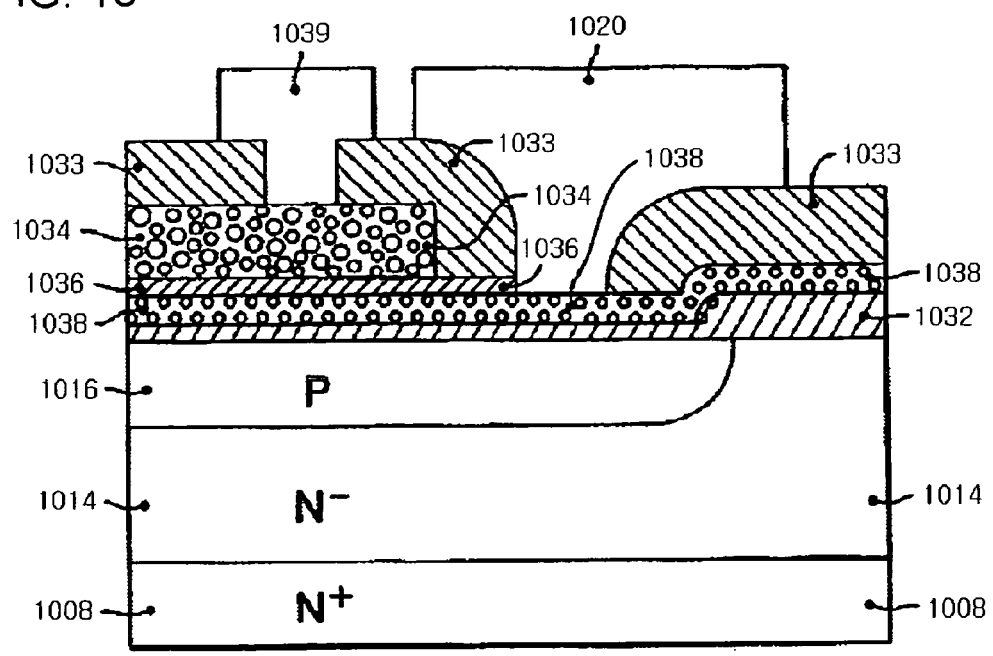
FIG. 15 is a cross-sectional view of the conventional vertical MOSFET, taken along the line E-E' of FIG. 14.

FIG. 13 illustrates this example. In this modification, the source extending region is formed at several locations in the cell region CR, or several locations indicated by D-D' in FIG. 13. Therefore, each D-D' cross section is the same as the cross section shown in FIG. 3. As shown in FIG. 3, in the source extending portion formed above the trench 201, the source interconnect layer 14 extends to a location immediately above the trench 201, to form a contact face with the source electrode 18. Accordingly, the necessary area for the source extension is small, and the source extension can be arranged in the cell region CR. For example, a space wide enough to accommodate two unit cells 104 is sufficient, as shown in the drawing. Accordingly, even if the source extending region (FIG. 3) is arranged at high density in the cell region CR, and high resistance is caused due to the low impurity doping density in the source interconnect layer 14, the source potential in the trench 101 can be stabilized.

In the above embodiment, the structure of each of the components is described in detail, but those structures may be modified in various manners within the scope of the invention.

For example, in the above embodiment, the opening width of the trench 301 is twice as large as the width of each of the trenches 101 and 201 in the transistor region (FIG. 2), the source extending region (FIG. 3), and the gate extending region (FIG. 4). However, the opening widths of the trenches 201 and 301 in the source extending region and the gate extending region can be enlarged to arbitrary widths within the scope of the invention, and can reduce the resistance of each of the trenches.

In the above embodiment, the gate electrode 16 and the gate interconnect layer 19 are in contact with each other in the trench 301, as shown in FIG. 4. More specifically, the gate electrode 16 is patterned by performing etchback without forming a resist serving as a mask. In this manner, the resist patterning procedure and the resist removing procedure become unnecessary. By this manufacture method, the number of procedures is made smaller than the number of procedures according to the conventional technique disclosed in Japanese Unexamined Patent Application Publication No. 2005-505912. The gate electrode 16 and the gate interconnect layer 19 may be in contact with each other immediately above the trench 301. In that case, however, a mask (a resist) is necessary for patterning the gate electrode 16, and the procedure reducing effect cannot be expected.

Also, in the above embodiment, an n-channel MOSFET has been described. However, the embodiment can be applied to a p-channel MOSFET. Further, the embodiment can be applied not only to MOSFETs but also to IGBTs (Insulated Gate Bipolar Transistors).

In the above embodiment, a FET having trenches in a lattice-like manner is described, as shown in FIG. 1. However, the above embodiment may be applied to a FET having trenches in a striped manner. In other words, the shapes of the trenches of FIG. 1 may be horizontally-long stripes (without ladder portions or portions vertically connecting the stripes). In that case, the source interconnect layers 14 formed in the respective trenches may be connected via the source electrode 18, and the gate electrodes 16 formed in the respective trenches may be connected via the gate interconnect layer 19.

It is apparent that the present invention is not limited to the above embodiment, and may be modified and changed without departing from the scope and spirit of the invention.

What is claimed is:
1. A semiconductor device, comprising:
a first-conductivity-type semiconductor layer;

a base region of a second-conductivity-type formed in an upper portion of the first-conductivity-type semiconductor layer;

first though third trenches penetrating through the base region and reaching to the first-conductivity-type semiconductor layer, the first through third trenches being linked to one another;

a source interconnect layer buried in the first through third trenches, the source interconnect layer comprising a protruding portion protruding from an upper end of the second trench;

a gate electrode buried in the first trench and the third trench, and formed over the source interconnect layer;

a source metal contacting the protruding portion of the source interconnect layer; and a gate metal contacting the gate electrode in the third trench, wherein a contact face between the source metal and the protruding portion at the second trench is higher than a contact face between the gate metal and the gate electrode at the third trench.

2. The semiconductor device according claim 1, further comprising a gate interconnect layer formed at a sidewall of the protruding portion of the source interconnect layer, wherein the gate electrode and the gate interconnect layer form a solid line.

3. The method according to claim 2, wherein the source interconnect layer comprises a first polysilicon layer, and wherein the gate electrode and the gate interconnect layer comprise a second polysilicon layer.

4. The semiconductor device, according to claim 1, wherein the gate electrode formed in the first trench is covered by an interlayer insulating film, and the source metal is formed over the interlayer insulating film.

5. The semiconductor device according to claim 1, wherein a width of the third trench is larger than a width of the first trench, and larger than a width of the second trench.

6. The semiconductor device according to claim 1, further comprising a source region of the first-conductivity-type formed in an upper portion of the base region, wherein both the source region and the base region contact the source metal.

7. The semiconductor device according to claim 6, wherein an upper surface of the gate electrode buried in the first trench is lower than an upper surface of the source region.

8. The semiconductor device according to claim 1, wherein an upper surface of the source interconnect layer buried in the first and third trenches is lower than the base region.

9. The semiconductor device according to claim 1, wherein the first-conductivity-type semiconductor layer comprises:

a cell region in which MOS transistor structure is provided; and a terminal region formed outside the cell region, wherein the first trench is formed in the cell region, and wherein the second and third trenches are formed in the terminal region.

10. The semiconductor device according to claim 9, wherein the third trench is formed outwardly of the second trench.

* * * * *